United States Patent
Slowko

(10) Patent No.: US 7,425,708 B2
(45) Date of Patent: Sep. 16, 2008

(54) SECONDARY ELECTRON DETECTOR UNIT FOR A SCANNING ELECTRON MICROSCOPE

(75) Inventor: Witold Slowko, Wroclaw (PL)

(73) Assignee: Politechnika Wrolawska, Wroclaw (PL)

( * ) Notice: Subject to any disclaimer, the term of this patent is extended or adjusted under 35 U.S.C. 154(b) by 153 days.

(21) Appl. No.: 11/248,431

(22) Filed: Oct. 13, 2005

(65) Prior Publication Data

US 2006/0027748 A1    Feb. 9, 2006

(51) Int. Cl.
*G01K 1/08* (2006.01)
(52) U.S. Cl. .................... 250/397; 250/396 R; 250/399
(58) Field of Classification Search ................. 250/311, 250/396 R–396 ML
See application file for complete search history.

(56) References Cited

U.S. PATENT DOCUMENTS

| | | | | |
|---|---|---|---|---|
| 5,387,793 A | * | 2/1995 | Sato et al. | 250/310 |
| 5,408,098 A | * | 4/1995 | Wells | 250/310 |
| 5,990,483 A | | 11/1999 | Shariv et al. | |
| 6,265,812 B1 | | 7/2001 | Watanabe et al. | |
| 6,646,262 B1 | * | 11/2003 | Todokoro et al. | 250/310 |

FOREIGN PATENT DOCUMENTS

| | | |
|---|---|---|
| JP | 62184752 | 8/1987 |
| PL | 329339 | 4/2000 |

OTHER PUBLICATIONS

Slowko, W., "Electron signal acquisition in HPSEM" Vacuum, 2003, 70, Elsevier Science Ltd., pp. 157 to 162.
PCT International Preliminary Report on Patentability, dated Oct. 21, 2005.

* cited by examiner

*Primary Examiner*—Jack I. Berman
*Assistant Examiner*—Andrew Smyth
(74) *Attorney, Agent, or Firm*—Walter Ottesen

(57) ABSTRACT

The secondary electron detector unit for a scanning electron microscope is mounted in a head body (1). In the lower part of the head body (1), a lower throttling aperture (2) is placed. Above the lower throttling aperture (2), the microporous plate (3) is sealed in the head body (1) by a gasket (5) and fastened with the use of the frame plate (6) which has an opening that exposes the active input area (7) placed asymmetrically with respect to the axis of the scanning electron beam (WE). Above the microporous plate (3), the scintillator (11) and the light pipe (12) are fixed at the side of the head body (1).

25 Claims, 1 Drawing Sheet

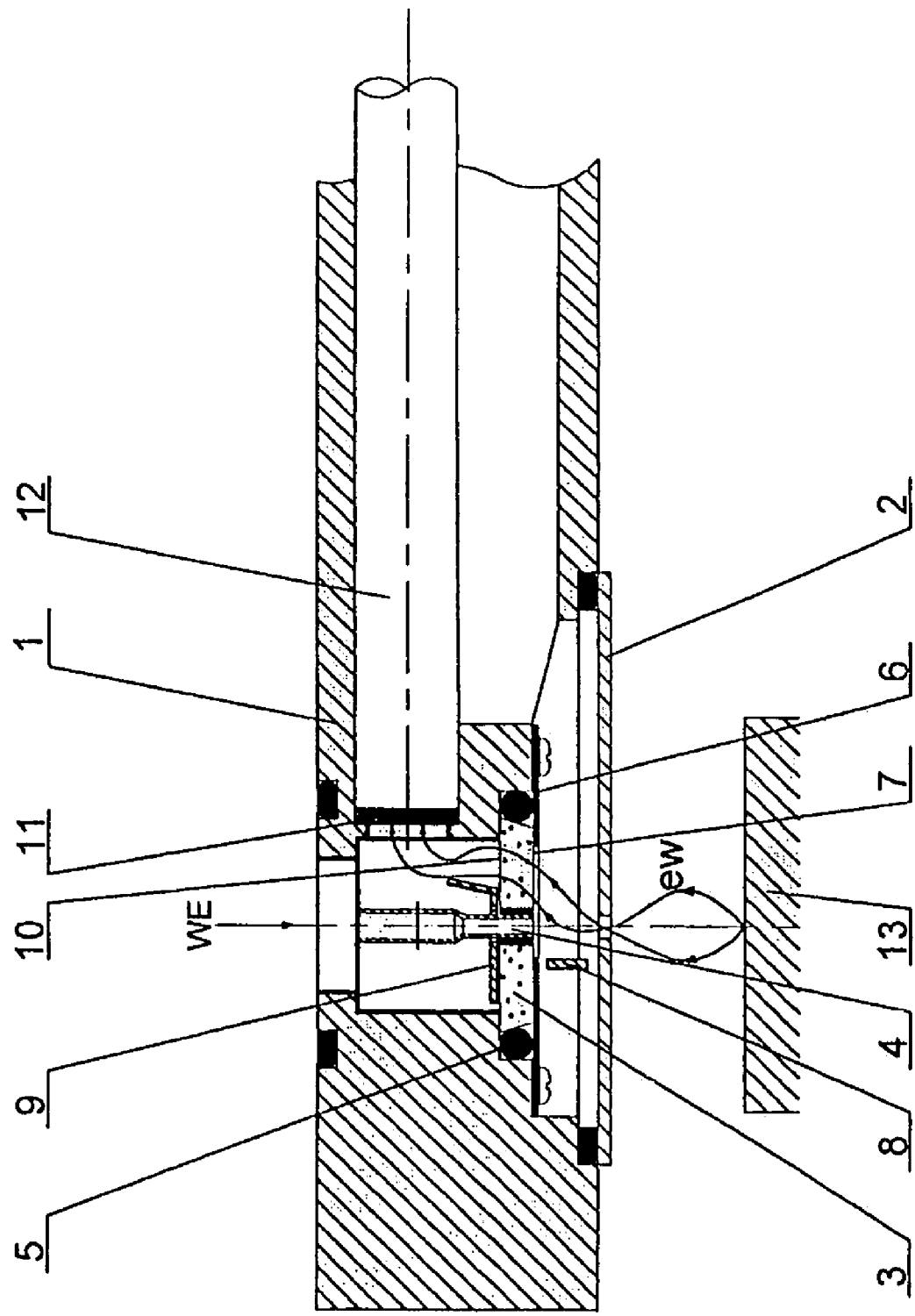

SECONDARY ELECTRON DETECTOR UNIT FOR A SCANNING ELECTRON MICROSCOPE

CROSS REFERENCE TO RELATED APPLICATION

This application claims priority of international patent application PCT/PL2004/000026, filed Apr. 9, 2004, and claiming priority from Polish patent application no. 359748, filed Apr. 17, 2003, and the entire content of both applications is incorporated herein by reference.

FIELD OF THE INVENTION

The subject of the invention is a secondary electron detector unit for a scanning electron microscope, particularly for operating at pressures of the order of 100 Pa in the specimen or sample chamber.

BACKGROUND OF THE INVENTION

A secondary electron detector unit known from the Polish patent application No. P 329339, entitled "High pressure scanning electron microscope", is composed of a secondary electron scintillator detector placed behind a microporous plate that is built into a vacuum wall separating an intermediate chamber and an electron optical column part. Here, the detector scintillator and the microporous plate are located coaxially with the electron optical column, along which the electron beam travels. A more functional solution for a secondary electron detector unit for a scanning electron microscope is known from the paper: W. Słówko entitled: "Electron signal acquisition in HPSEM", Vacuum 2003, vol. 70, p. 157. In this solution a scintillator is placed aside from the electron optical axis. In both solutions, a stream of secondary electrons is guided into the intermediate chamber through a hole in a lower throttling aperture and impinges symmetrically the input surface of the microporous plate, which is placed at the electron optical axis. The electrons passing across the microporous plate are multiplied and, at the output side, they are attracted by the scintillator biased with a high voltage and finally detected. The active input surface of the microporous plate is ring-shaped and coaxial with the electron beam. In the central part, it is limited by the hole made on the axis of the microporous plate to let through the electron beam while its maximum diameter is limited by the opening in the frame plate, which also fixes the microporous plate in the frame body of the detector.

SUMMARY OF THE INVENTION

According to a feature of the invention, the active input area of the microporous plate is disposed asymmetrically with respect to the axis of the scanning electron beam.

According to a first embodiment of the invention, a secondary electron detector unit is provided for a scanning electron microscope defining an optical axis along which a primary electron beam impinges on a sample, the secondary electron detector unit comprising a scintillator detector, a microporous plate defining an output side directed to the scintillator detector and an input side opposite the output side and having an active input area on the input side and an active output area on the output side, the active input area being arranged asymmetrically with respect to the optical axis of the scanning electron microscope, an aperture device with a small opening at the optical axis, the microporous plate being arranged between the aperture and the scintillator detector, and at least one electrode arranged at the input side of said microporous plate or between the microporous plate and the aperture device.

According to another embodiment of the invention, a secondary electron detector unit is provided for a scanning electron microscope defining an optical axis along which a primary electron beam impinges on a sample, the secondary electron detector unit comprising a scintillator detector, a microporous plate defining an output side directed to the scintillator detector and an input side opposite the output side and having an active input area on the input side and an active output area on the output side, the active input area being arranged asymmetrically with respect to the optical axis of the scanning electron microscope, at least one electrode arranged at the input side of the microporous plate and the at least one electrode begin biased with a voltage to deflect secondary electrons emitted by the sample to the active input area of the microporous plate.

The advantages of the secondary electron detector unit for a scanning electron microscope according to the invention are that the gas flow to the high vacuum part can be reduced and the detector lifetime can be prolonged while the sensitivity of the detector is preserved.

BRIEF DESCRIPTION OF THE DRAWING

The invention will now be described with reference to the single figure of the drawing (FIG. 1) which shows, in section, an embodiment of the secondary electron detector unit of the invention for a scanning electron microscope.

DESCRIPTION OF THE PREFERRED EMBODIMENTS OF THE INVENTION

The secondary electron detector unit for a scanning electron microscope is mounted in a head body 1 made of TEFLON. A lower throttling aperture 2 is disposed in the lower part of the head body 1. The throttling aperture 2 is in the form of a metal plate with a small hole at the axis of the electron beam WE. A microporous plate 3 is located above the lower throttling aperture 2. The microporous plate 3 has a hole at the axis of the electron beam WE, in which a screen pipe 4 is fastened by means of a TEFLON seal. The microporous plate 3 is sealed in the head body 1 by a gasket 5 and fastened with use of a frame plate 6 which has an opening that leaves an active input area 7 of the microporous plate uncovered. Between the lower throttling aperture 2 and the frame plate 6, a deflecting electrode 8 is placed. A screen plate 9 is located at an output side of the microporous plate 3. The screen plate 9 is bent to reveal an active output area 10 of the microporous plate 3 located at a scintillator 11 and a light pipe 12 end, because the scintillator 11 and the light pipe 12 are fixed at the side of the head body 1.

The secondary electron detector unit for a scanning electron microscope arranged in the described way operates as follows.

Secondary electrons ew generated from a sample 13 are attracted by the lower throttling aperture 2 biased positively and pass through the hole in the electrode. At the other side of the lower throttling aperture 2, the stream of the secondary electrons ew is deflected toward the active input area 7 of the microporous plate 3 by the deflecting electrode 8. When proper bias voltages are applied to the lower throttling aperture 2, the deflecting electrode 8 and the frame plate 6, the stream of secondary electrons ew can be focused on the active input area 7. Secondary electrons ew pass through microscopic channels of the microporous plate 3 biased with a voltage in the order of 1 kV, and are multiplied due to secondary emission from its walls. The multiplied stream of secondary electrons ew escapes the microporous plate 3 in the active output area 10 that is not blocked off by the screen plate 9. Then, secondary electrons ew are attracted by the scintillator 11 biased positively at about 12 kV, and they generate a light signal transmitted further by the light pipe 12.

If the secondary electrons ew are focused accurately, the active input area 7 may be reduced to a small fraction of the microporous plate 3 input surface. In this case, the harmful flow of gas through the microporous plate 3 can be reduced proportionally. Besides, the active input area 7 may occupy only. a sector of the microporous plate 3, so the plate need not be exchanged when the sector is contaminated. It would be enough to rotate the plate by a certain angle around the electron beam axis WE and an uncontaminated portion of the microporous plate 3 can be seen in the opening of the frame plate 6 that defines the active input area 7. Such an operation may be repeated several times depending on the size of the active input area 7 and the total area of the microporous plate 3.

It is understood that the foregoing description is that of the preferred embodiments of the invention and that various changes and modifications may be made thereto without departing from the spirit and scope of the invention as defined in the appended claims.

What is claimed is:

1. A secondary electron detector unit for a scanning electron microscope defining an optical axis along which a primary electron beam impinges on a sample, said secondary electron detector unit comprising:
    a head body;
    a scintillator mounted in said head body;
    a microporous plate defining an output side directed toward said scintillator and an input side opposite said output side and having an active input area on said input side and an active output area on said output side;
    said active input area being arranged asymmetrically with respect to said optical axis of said scanning electron microscope;
    said microporous plate being sealed in said head body to restrict gas flow from one of said sides of said microporous plate to the other one of said sides thereof;
    a throttling aperture device having a small opening at said optical axis;
    said throttling aperture device being mounted in said head body;
    said microporous plate being arranged between said throttling aperture device and said scintillator; and,
    at least one electrode arranged at said input side of said microporous plate or between said microporous plate and said throttling aperture device.

2. The secondary electron detector unit of claim 1, wherein said at least one electrode is biased with a voltage to deflect secondary electrons emitted by said sample to said active input area of said microporous plate.

3. The secondary electron detector unit of claim 1, wherein a positive bias voltage is applied to said microporous plate so that secondary electrons passing through said microporous plate are multiplied due to secondary electron emission within said microporous plate.

4. The secondary electron detector unit of claim 1, wherein said throttling aperture device is a metal plate having a hole and a positive voltage is applied to said metal plate to attract secondary electrons emitted from said sample.

5. The secondary electron detector unit of claim 1, wherein said microporous plate surrounds said optical axis of said scanning electron microscope and has a hole at said optical axis of said scanning electron microscope.

6. The secondary electron detector unit of claim 1, further comprising a frame plate to which said microporous plate is fastened.

7. The secondary electron detector unit of claim 6, wherein said frame plate has an opening which exposes a portion of said microporous plate; and, said exposed portion defines said active input area of said microporous plate.

8. The secondary electron detector unit of claim 1, further comprising a screen plate at said output side of said microporous plate; and, said screen plate being configured so as to cause said active output area of said microporous plate to be uncovered.

9. The secondary electron detector unit of claim 1, further comprising a gasket and wherein said microporous plate is sealed to said head body by said gasket.

10. The secondary electron detector unit of claim 1, wherein said microporous plate is mounted rotatably around said optical axis.

11. A secondary electron detector unit for a scanning electron microscope defining an optical axis along which a primary electron beam impinges on a sample, said secondary electron detector unit comprising:
    a head body;
    a scintillator mounted in said head body;
    a microporous plate defining an output side directed toward said scintillator and an input side opposite said output side and having an active input area on said input side and an active output area on said output side;
    said active input area being arranged asymmetrically with respect to said optical axis of said scanning electron microscope;
    said microporous plate being sealed in said head body to restrict gas flow from one of said sides of said microporous plate to the other one of said sides thereof; and,
    at least one electrode arranged at said input side of said microporous plate and said at least one electrode being biased with a voltage to deflect secondary electrons emitted by said sample to said active input area of said microporous plate.

12. The secondary electron detector unit of claim 11, further comprising a throttling aperture device having a small opening at said optical axis; said throttling aperture device being mounted in said head body; and, said at least one electrode being arranged between said aperture device and said microporous plate.

13. The secondary electron detector unit of claim 11, wherein a positive bias voltage is applied to said microporous plate so that secondary electrons passing through said microporous plate are multiplied due to secondary electron emission within said microporous plate.

14. The secondary electron detector unit of claim 11, wherein said microporous plate surrounds said optical axis of said scanning electron microscope and has a hole at said optical axis of said scanning electron microscope.

15. The secondary electron detector unit of claim 11, further comprising a frame plate to which said microporous plate is fastened.

16. The secondary electron detector unit of claim 15, wherein said frame plate has an opening which exposes a portion of said microporous plate; and, said exposed portion defines said active input area of said microporous plate.

17. The secondary electron detector unit of claim 11, further comprising a screen plate at said output side of said microporous plate; and, said screen plate being configured so as to cause said active output area of said microporous plate to be uncovered.

18. The secondary electron detector unit of claim 11, further comprising a gasket and wherein said microporous plate is sealed to said head body by said gasket.

19. The secondary electron detector unit of claim 11, wherein said microporous plate is mounted rotatably around said optical axis.

20. A secondary electron detector unit for a scanning electron microscope defining an optical axis along which a primary electron beam impinges on a sample, said secondary electron detector unit comprising:
a scintillator;
a microporous plate defining an output side directed toward said scintillator and an input side opposite said output side and having an active input area on said input side and an active output area on said output side;
said active input area being arranged asymmetrically with respect to said optical axis of said scanning electron microscope;
a throttling aperture device having a small opening at said optical axis;
said microporous plate being arranged between said throttling aperture device and said scintillator;
at least one electrode arranged at said input side of said microporous plate or between said microporous plate and said throttling aperture device;
said at least one electrode being biased with a voltage to deflect secondary electrons emitted by said sample to said active input area of said microporous plate; and,
wherein a positive bias voltage is applied to said microporous plate so that secondary electrons passing through said microporous plate are multiplied due to secondary electron emission within said microporous plate.

21. A secondary electron detector unit for a scanning electron microscope defining an optical axis along which a primary electron beam impinges on a sample, said secondary electron detector unit comprising:
a scintillator;
a microporous plate defining an output side directed toward said scintillator and an input side opposite said output side and having an active input area on said input side and an active output area on said output side;
said active input area being arranged asymmetrically with respect to said optical axis of said scanning electron microscope;
a throttling aperture device having a small opening at said optical axis;
said microporous plate being arranged between said throttling aperture device and said scintillator;
at least one electrode arranged at said input side of said microporous plate or between said microporous plate and said throttling aperture device; and,
said microporous plate surrounding said optical axis of said scanning electron microscope and having a hole at said optical axis of said scanning electron microscope.

22. A secondary electron detector unit for a scanning electron microscope defining an optical axis along which a primary electron beam impinges on a sample, said secondary electron detector unit comprising:
a scintillator;
a microporous plate defining an output side directed toward said scintillator and an input side opposite said output side and having an active input area on said input side and an active output area on said output side;
said active input area being arranged asymmetrically with respect to said optical axis of said scanning electron microscope;
at least one electrode arranged at said input side of said microporous plate and said at least one electrode being biased with a voltage to deflect secondary electrons emitted by said sample to said active input area of said microporous plate; and,
wherein a positive bias voltage is applied to said microporous plate so that secondary electrons passing through said microporous plate are multiplied due to secondary electron emission within said microporous plate.

23. A secondary electron detector unit for a scanning electron microscope defining an optical axis along which a primary electron beam impinges on a sample, said secondary electron detector unit comprising:
a scintillator;
a microporous plate defining an output side directed toward said scintillator and an input side opposite said output side and having an active input area on said input side and an active output area on said output side;
said active input area being arranged asymmetrically with respect to said optical axis of said scanning electron microscope;
at least one electrode arranged at said input side of said microporous plate and said at least one electrode being biased with a voltage to deflect secondary electrons emitted by said sample to said active input area of said microporous plate; and,
said microporous plate surrounding said optical axis of said scanning electron microscope and having a hole at said optical axis of said scanning electron microscope.

24. A secondary electron detector unit for a scanning electron microscope defining an optical axis along which a primary electron beam impinges on a sample, said secondary electron detector unit comprising:
a scintillator detector;
a microporous plate defining an output side directed toward said scintillator detector and an input side opposite said output side and having an active input area on said input side and an active output area on said output side;
said active input area being arranged asymmetrically with respect to said optical axis of said scanning electron microscope;
an aperture device having a small opening at said optical axis;
said microporous plate being arranged between said aperture device and said scintillator detector;
at least one electrode arranged at said input side of said microporous plate or between said microporous plate and said aperture device; and,
said microporous plate being mounted rotatably around said optical axis.

25. A secondary electron detector unit for a scanning electron microscope defining an optical axis along which a primary electron beam impinges on a sample, said secondary electron detector unit comprising:

a scintillator detector;

a microporous plate defining an output side directed toward said scintillator detector and an input side opposite said output side and having an active input area on said input side and an active output area on said output side;

said active input area being arranged asymmetrically with respect to said optical axis of said scanning electron microscope;

at least one electrode arranged at said input side of said microporous plate and said at least one electrode being biased with a voltage to deflect secondary electrons emitted by said sample to said active input area of said microporous plate; and, said microporous plate being mounted rotatably around said optical axis.

* * * * *

UNITED STATES PATENT AND TRADEMARK OFFICE
CERTIFICATE OF CORRECTION

PATENT NO. : 7,425,708 B2
APPLICATION NO. : 11/248431
DATED : September 16, 2008
INVENTOR(S) : Witold Slowko Page 1 of 1

It is certified that error appears in the above-identified patent and that said Letters Patent is hereby corrected as shown below:

Title Page:
Under item (73) Assignee: delete "Wrolawska" and insert -- Wroclawska -- therefor.

Title Page:
Insert item -- Related U.S. Application Data
(63) Continuation of application No. PCT/PL2004/000026, filed on April 9, 2004. --.

Title Page:
Insert item -- (30) Foreign Application Priority Data
April 17, 2003 (PL) ……………….…… 359748 --.

Column 1:
Line 6: delete "APPLICATION" and substitute -- APPLICATIONS -- therefor.

Column 2:
Line 17: delete "begin" and substitute -- being -- therefor.

Column 3:
Line 14: delete "only." and substitute -- only -- therefor.

Signed and Sealed this

Third Day of March, 2009

JOHN DOLL
*Acting Director of the United States Patent and Trademark Office*